(12) United States Patent
Kang et al.

(10) Patent No.: US 11,733,793 B2
(45) Date of Patent: Aug. 22, 2023

(54) ELECTRONIC DEVICE AND ELECTRONIC DEVICE TESTING METHOD

(71) Applicant: Samsung Display Co., Ltd., Yongin-Si (KR)

(72) Inventors: Bongil Kang, Namyangju-si (KR); Sangkook Kim, Cheonan-si (KR); Gayeon Yun, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 133 days.

(21) Appl. No.: 17/487,165

(22) Filed: Sep. 28, 2021

(65) Prior Publication Data

US 2022/0253168 A1 Aug. 11, 2022

(30) Foreign Application Priority Data

Feb. 9, 2021 (KR) .......................... 10-2021-0018488

(51) Int. Cl.
*G06F 3/041* (2006.01)
*G06F 3/044* (2006.01)
*G01R 27/26* (2006.01)

(52) U.S. Cl.
CPC ....... *G06F 3/0412* (2013.01); *G01R 27/2605* (2013.01); *G06F 3/0443* (2019.05);
(Continued)

(58) Field of Classification Search
CPC .. G06F 3/0412; G06F 3/04164; G06F 3/0443; G06F 3/0446; G06F 3/0447; G06F 2203/04111; G01R 27/2605; G01R 31/2829; G01R 31/54; G01R 31/2825; G01R 23/005; G01R 23/02; G01R 31/2843; G01R 31/2849; G01R 31/52; H01L 22/34; H10K 59/123; H10K 59/131; H10K 71/70
See application file for complete search history.

(56) References Cited

U.S. PATENT DOCUMENTS 5,883,437 A * 3/1999 Maruyama ............ H01L 21/485
257/773
9,535,108 B2 * 1/2017 Fukami .............. G01R 31/2812
(Continued)

FOREIGN PATENT DOCUMENTS

KR 10-0639005 10/2006
KR 10-2020-0013319 2/2020
(Continued)

*Primary Examiner* — Amy Onyekaba
(74) *Attorney, Agent, or Firm* — F. Chau & Associates, LLC

(57) ABSTRACT

A method of testing an electronic device includes providing an electronic device. The electronic device includes a display layer that includes a common electrode. The electronic device also includes a sensor layer disposed on the display layer and that includes a first sensing electrode and a second sensing electrode. The first sensing electrode and the second sensing electrode cross each other and are electrically disconnected. The method further includes providing a test signal that includes a test frequency to the first sensing electrode, measuring a capacitance of a capacitor disposed between the first and second sensing electrodes based on the test signal, and testing the common electrode based on the capacitance.

20 Claims, 10 Drawing Sheets

(52) U.S. Cl.
CPC .......... *G06F 3/0446* (2019.05); *G06F 3/0447* (2019.05); *G06F 3/04164* (2019.05); *G06F 2203/04111* (2013.01)

(56) References Cited

U.S. PATENT DOCUMENTS

| | | | | |
|---|---|---|---|---|
| 2010/0007615 A1* | 1/2010 | Wu | ................ | G06F 3/047 345/173 |
| 2010/0085322 A1* | 4/2010 | Mamba | ................ | G06F 3/0418 345/173 |
| 2010/0251800 A1* | 10/2010 | Mueck | ................ | G01P 21/00 73/1.38 |
| 2011/0140720 A1* | 6/2011 | Kurashima | ................ | G06F 3/0443 324/686 |
| 2011/0267309 A1* | 11/2011 | Hanauer | ................ | G06F 3/0416 345/174 |
| 2012/0001839 A1* | 1/2012 | Tsubata | ................ | G02F 1/136259 345/90 |
| 2014/0225634 A1* | 8/2014 | Broillet | ................ | G01L 27/002 324/750.01 |
| 2014/0232691 A1* | 8/2014 | Lee | ................ | G06F 3/0443 345/174 |
| 2015/0108997 A1* | 4/2015 | Fukami | ................ | G01R 31/2812 324/538 |
| 2015/0185932 A1* | 7/2015 | Lu | ................ | G06F 3/04164 345/173 |
| 2015/0206495 A1* | 7/2015 | Xu | ................ | G09G 3/3677 345/94 |
| 2015/0311130 A1* | 10/2015 | Zhang | ................ | H01L 27/124 257/48 |
| 2016/0147320 A1* | 5/2016 | Krumpelman | ................ | G06F 3/04166 345/179 |
| 2016/0357283 A1* | 12/2016 | Xu | ................ | G02F 1/133308 |
| 2017/0168088 A1* | 6/2017 | Coronato | ................ | G01P 15/125 |
| 2017/0255292 A1* | 9/2017 | Xie | ................ | G06F 3/0443 |
| 2019/0027076 A1* | 1/2019 | Lee | ................ | G02F 1/136213 |
| 2020/0036386 A1 | 1/2020 | Choi | | |
| 2020/0058241 A1* | 2/2020 | Moon | ................ | G09G 3/3225 |
| 2020/0192522 A1* | 6/2020 | Reynolds | ................ | H03K 17/941 |
| 2020/0212114 A1 | 7/2020 | Song | | |
| 2020/0326211 A1* | 10/2020 | Xie | ................ | G01B 7/14 |
| 2021/0255727 A1* | 8/2021 | Pirogov | ................ | G06F 3/044 |
| 2021/0302774 A1* | 9/2021 | Yu | ................ | G02F 1/13394 |
| 2022/0253168 A1* | 8/2022 | Kang | ................ | G06F 3/0412 |

FOREIGN PATENT DOCUMENTS

| | | |
|---|---|---|
| KR | 10-2020-0021570 | 3/2020 |
| KR | 10-2020-0082738 | 7/2020 |

* cited by examiner

ELECTRONIC DEVICE AND ELECTRONIC DEVICE TESTING METHOD

CROSS-REFERENCE TO RELATED APPLICATIONS

This U.S. non-provisional patent application claims priority under 35 U.S.C. § 119 to Korean Patent Application No. 10-2021-0018488, filed on Feb. 9, 2021, in the Korean Intellectual Property Office, the disclosure of which is incorporated by reference herein in its entirety.

TECHNICAL FIELD

Embodiments of the inventive concept relate to an electronic device, and more particularly, to an electronic device and a method of testing an electronic module.

DISCUSSION OF RELATED ART

An electronic device, such as a smart phone, a television set, and a monitor, may include various components such as a display layer with a common electrode and a sensor layer. In order to realize a reliable electronic device, it is helpful to examine or test operation characteristics of the various components and electric connection states between the various components during development and fabrication of the electronic device.

SUMMARY

Embodiments of the inventive concept provide an electronic device with increased reliability and a method of testing an electronic device.

According to an embodiment of the inventive concept, a method of testing an electronic device includes providing an electronic device. The electronic device includes a display layer that includes a common electrode. The electronic device also includes a sensor layer disposed on the display layer and that includes a first sensing electrode and a second sensing electrode. The first sensing electrode and the second sensing electrode cross each other and are electrically disconnected. The method further includes providing a test signal that includes a test frequency to the first sensing electrode, measuring a capacitance of a capacitor disposed between the first and second sensing electrodes based on the test signal, and testing the common electrode based on the capacitance.

In an embodiment, the test frequency ranges from about 500 kHz to about 700 kHz.

In an embodiment, the electronic device further includes a power supply that provides a power to the common electrode, and the display layer further includes a first connection electrode, a second connection electrode, a third connection electrode, and a fourth connection electrode electrically connecting the common electrode to the power supply.

In an embodiment, each of the first and second connection electrodes extend in a first direction facing each other, and each of the third and fourth connection electrodes extend in a second direction crossing the first direction and are adjacent to each other.

In an embodiment, the testing of the common electrode includes determining an electric connection state between the common electrode and the first to fourth connection electrodes.

In an embodiment, the determining of the electric connection state between the common electrode and the first to fourth connection electrodes includes determining that at least one of the first to the fourth connection electrodes is electrically disconnected from the common electrode when the capacitance is higher than a reference capacitance.

In an embodiment, the determining of the electric connection state between the common electrode and the first to fourth connection electrodes includes determining that each of the first to the fourth connection electrodes is electrically connected to the common electrode when the capacitance is equal to a reference capacitance.

In an embodiment, the capacitor includes a first capacitor between the first and second sensing electrodes and a second capacitor between the first sensing electrode, the common electrode, and the second sensing electrode.

In an embodiment, the test signal includes a first signal that includes information corresponding to the first capacitor, and a second signal that includes information corresponding to the second capacitor.

In an embodiment, the providing of the test signal includes changing the capacitance based on changing the second signal.

In an embodiment, the testing of the common electrode includes determining that the common electrode is in a failed state when the capacitance is higher than a reference capacitance.

In an embodiment, the testing of the common electrode includes determining that the common electrode is in a not-failed state when the capacitance is equal to a reference capacitance.

In an embodiment, a distance between the first sensing electrode and the common electrode ranges from about 8 μm to about 12 μm.

According to an embodiment of the inventive concept, a method of testing an electronic device includes providing the electronic device. The electronic device includes a display layer that includes a common electrode. The electronic device further includes a sensor layer directly disposed on the display layer and that includes a plurality of sensing electrodes operating at a driving frequency. The method further includes providing a test signal that includes a test frequency higher than the driving frequency to some sensing electrodes of the plurality of sensing electrodes, and determining whether the common electrode is in a failed state based on the test signal.

In an embodiment, the test frequency ranges from about 500 kHz to about 700 kHz.

In an embodiment, the test signal includes a first signal and a second signal, the first signal is different from the second signal, the first signal includes information corresponding to a first capacitor disposed between a pair of sensing electrodes of the plurality of sensing electrodes, and the second signal includes information corresponding to a second capacitor disposed between a first sensing electrode of the plurality of sensing electrodes, the common electrode, and a second sensing electrode of the plurality of sensing electrodes.

In an embodiment, the determining whether the common electrode is in a failed state includes determining that the common electrode is in the failed state when a sum of capacitances of the first and second capacitors is higher than a reference capacitance.

In an embodiment, the determining whether the common electrode is in a failed state includes determining that the common electrode is in a not-failed state when a sum of capacitances of the first and second capacitors is equal to a reference capacitance.

According to an embodiment of the inventive concept, an electronic device includes a display layer that includes a common electrode and a plurality of connection electrodes electrically connected to the common electrode. The electronic device further includes a sensor layer disposed on the display layer. The sensor layer includes a first sensing electrode and a second sensing electrode crossing each other and electrically disconnected. The electronic device further includes a power supply that provides a power to the common electrode. The plurality of connection electrodes is electrically connected to the power supply and includes a first connection electrode and a second connection electrode extending in a first direction and facing each other, and a third connection electrode and a fourth connection electrode extending in a second direction crossing the first direction and adjacent to each other.

In an embodiment, a distance between the first sensing electrode and the common electrode ranges from about 8 μm to about 12 μm.

BRIEF DESCRIPTION OF THE DRAWINGS

The above and other features of the inventive concept will become more apparent by describing in detail embodiments thereof with reference to the accompanying drawings, in which.

The use of similar or identical reference numbers in the various drawings is intended to indicate the presence of a similar or identical element or feature.

DETAILED DESCRIPTION

Figure 1:
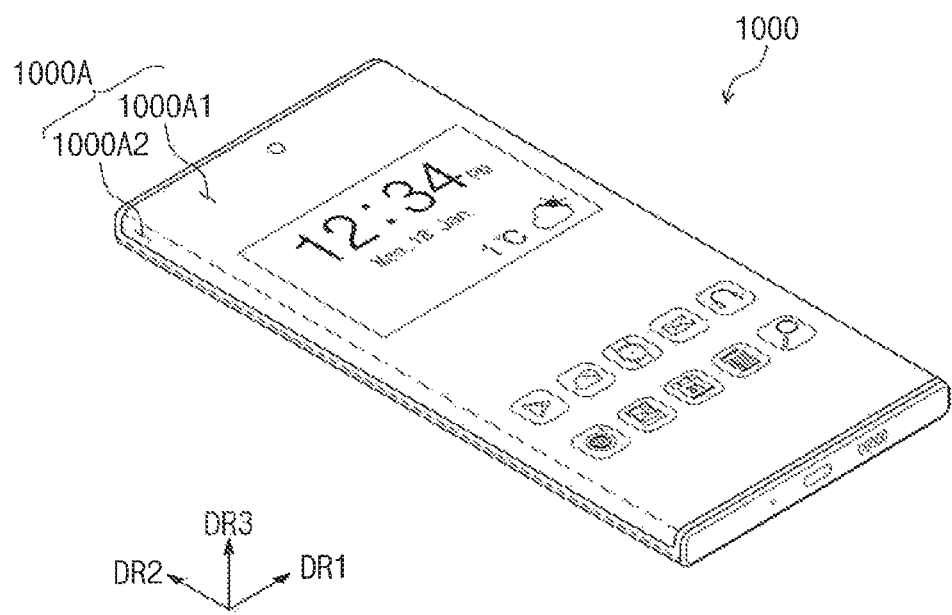
FIG. 1 is a perspective view of an electronic device according to an embodiment of the inventive concept.

Embodiments of the inventive concept will be described more fully hereinafter with reference to the accompanying drawings. Like reference numerals may refer to like elements throughout the accompanying drawings, and redundant descriptions will therefore be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, the singular forms "a," "an", and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

FIG. 1 is a perspective view of an electronic device according to an embodiment of the inventive concept.

Referring to FIG. 1, an electronic device 1000 may be implemented as a large-sized electronic device (e.g., a television, a monitor, or an outdoor billboard). In addition, the electronic device 1000 may be implemented as at least one of small-sized or medium-sized electronic devices (e.g., personal computers, laptop computers, personal digital assistants, car navigation systems, gaming machines, smart phones, tablets, and cameras). FIG. 1 illustrates an embodiment in which the electronic device 1000 is a cellular phone. However, the electronic device 1000 may alternatively or additionally be implemented as and/or include other electronic devices as discussed above.

The electronic device 1000 may include an active region 1000A that may display an image. The active region 1000A may include a first display surface 1000A1 parallel to a surface defined by two different directions (e.g., a first direction DR1 and a second direction DR2) and a second display surface 1000A2 extending from the first display surface 1000A1.

The second display surface 1000A2 may curvedly extend from a side edge of the first display surface 1000A1. Furthermore, the active region 1000A may include a plurality of second display surfaces 1000A2. In this case, the plurality of second display surfaces 1000A2 may curvedly extend from at least two side edges of the first display surface 1000A1. In an embodiment, the active region 1000A may include a first display surface 1000A1 and one to four second display surfaces 1000A2. However, the shape of the active region 1000A is not necessarily limited thereto. For example, in an embodiment, only the first display surface 1000A1 may be included in the active region 1000A.

A thickness direction of the electronic device 1000 may be parallel to a third direction DR3 that is perpendicular to the first and second directions DR1 and DR2. A front or top surface and a rear or bottom surface of each component of the electronic device 1000 and the electronic device 1000 itself may therefore be defined based on the third direction DR3.

Figure 2:
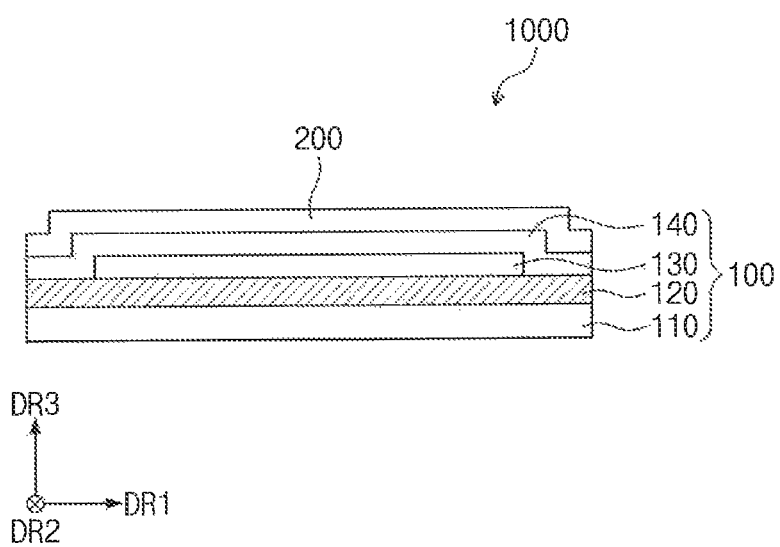
FIG. 2 is a sectional view of the electronic device of FIG. 1 according to an embodiment of the inventive concept.

FIG. 2 is a sectional view of the electronic device 1000 according to an embodiment of the inventive concept.

Referring to FIG. 2, the electronic device 1000 may include a display layer 100 and a sensor layer 200.

In an embodiment, the display layer 100 may be a light-emitting type display layer, but the display layer 100 may alternatively or additionally be an organic light emitting display layer, a quantum dot display layer, a micro-LED display layer, or a nano-LED display layer. The display layer 100 may include a base layer 110, a circuit layer 120, an emission device layer 130, and an encapsulation layer 140.

The base layer 110 may be an element that includes a base surface on which the circuit layer 120 is disposed. The base layer 110 may be a glass substrate, a metal substrate, or a polymer substrate, and the base layer 110 may alternatively or additionally include an inorganic layer, an organic layer, or a layer made of a composite material.

The base layer 110 may be arranged in a multi-layered structure. For example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may be formed of or include at least one of polyimide-based resins.

In addition, each of the first and second synthetic resin layers may include at least one of acrylate-based resins, methacrylate-based resins, polyisoprene-based resins, vinyl-based resins, epoxy-based resins, urethane-based resins, cellulose-based resins, siloxane-based resins, polyamide-based resins, or perylene-based resins. As used herein, the expression "X-based resins" should be understood to mean that such materials include functional groups of the material "X".

The circuit layer 120 may be disposed on the base layer 110. The circuit layer 120 may include at least one of an insulating layer, a semiconductor pattern, a conductive pattern, a signal line, or the like. In an embodiment, the formation of the circuit layer 120 may include forming an insulating layer, a semiconductor layer, and a conductive layer on the base layer 110 via a coating or deposition method, and then selectively patterning the insulating layer, the semiconductor layer, and the conductive layer via a repeated photolithography process. As a result of the coating or deposition method and the selective patterning, the semiconductor pattern, the conductive pattern, and the signal line constituting the circuit layer 120 may be formed.

The emission device layer 130 may be disposed on the circuit layer 120. The emission device layer 130 may include an emission device. For example, the emission device layer 130 may include an organic light emitting material, quantum dots, quantum rods, micro-LEDs, or nano-LEDs.

The encapsulation layer 140 may be disposed on the emission device layer 130. The encapsulation layer 140 may protect the emission device layer 130 from a contaminating material, such as moisture, oxygen, or dust particles by at least partially covering the emission device layer 130.

The sensor layer 200 may be formed on the display layer 100 in a successive manner. In an embodiment, the sensor layer 200 may be directly disposed on the display layer 100, such that another element or layer is not disposed between the sensor layer 200 and the display layer 100.

That is, an additional adhesive layer may be omitted between the sensor layer 200 and the display layer 100. In an embodiment, the sensor layer 200 and the display layer 100 may be coupled to each other by an adhesive material. The adhesive material may be a typical adhesive material or a typical glue.

Although not shown, a window may be disposed on the sensor layer 200. The window may protect internal elements of the electronic device 1000 from an external impact and may be implemented as the active region 1000A of the electronic device 1000. For example, the window may include a glass substrate, a sapphire substrate, or a plastic film. The window may be arranged in a single-layered or multi-layered structure. For example, the window may be arranged in a stacking structure that includes a plurality of plastic films coupled to each other by an adhesive layer or that includes a glass substrate and a plastic film coupled to each other by an adhesive layer.

Figure 3:
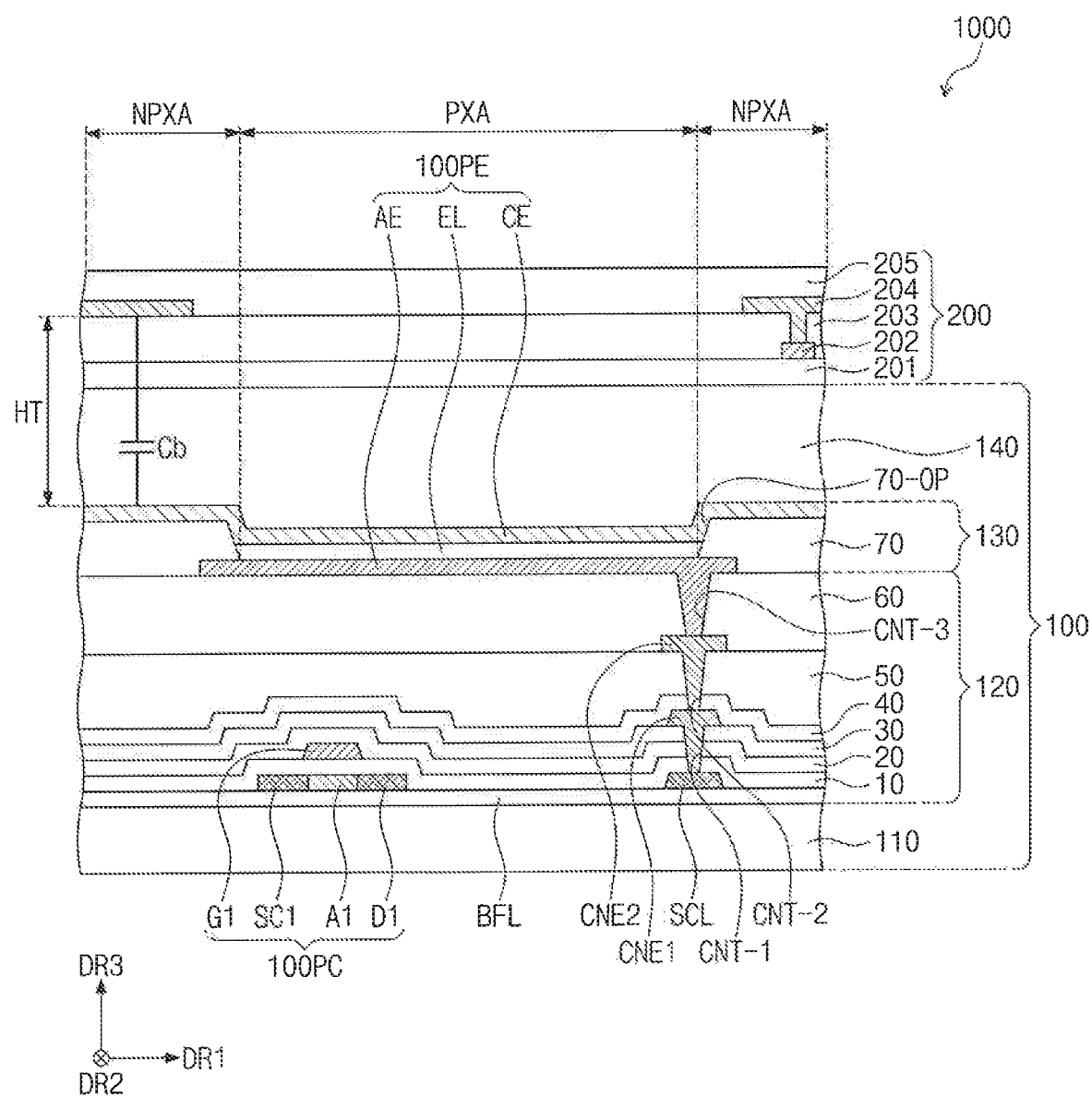
FIG. 3 is a sectional view of the electronic device of FIG. 1 according to an embodiment of the inventive concept.

FIG. 3 is a sectional view of the electronic device 1000 according to an embodiment of the inventive concept. The description of elements previously described with reference to FIG. 2 will be omitted for the sake of brevity.

Referring to FIG. 3, at least one inorganic layer may be formed on a top surface of the base layer 110. The inorganic layer may be formed of or include at least one of aluminum oxide, titanium oxide, silicon oxide silicon oxynitride, zirconium oxide, or hafnium oxide. For example, the at least one inorganic layer may include a plurality of inorganic layers arranged in a multi-layered structure. The at least one inorganic layer may be used as a barrier layer and/or a buffer layer. In an embodiment, the display layer 100 includes a buffer layer BFL.

The buffer layer BFL may increase a bonding strength between the base layer 110 and the semiconductor pattern. The buffer layer BFL may include a silicon oxide layer and a silicon nitride layer that are alternately stacked.

The semiconductor pattern may be disposed on the buffer layer BFL. The semiconductor pattern may be formed of or include polysilicon, and the semiconductor pattern may alternatively or additionally be formed of or include at least one of amorphous silicon, low-temperature poly silicon, or oxide semiconductor materials.

Although a portion of the semiconductor pattern is illustrated in FIG. 3, the semiconductor pattern may include another portion disposed in other regions of the electronic device 1000. In an embodiment, the semiconductor pattern may be arranged in various manners throughout a plurality of pixels of the electronic device 1000. Electrical characteristics of the semiconductor pattern may vary depending on a doping state of the semiconductor pattern. The semiconductor pattern may include a first region with high conductivity and a second region with low conductivity. The first region may be doped with n-type or p-type dopants. Among semiconductor transistors, a p-type transistor may include an impurity region doped with p-type dopants, and an n-type transistor may include an impurity region doped with n-type dopants. In an embodiment, the second region may be a non-doped region or may have a lower dopant concentration than the first region.

The first region may have higher conductivity than the second region and may be substantially implemented as an electrode or a signal line. The second region may be substantially implemented as an active or channel region of a transistor. In other words, a second region of the semiconductor pattern may be an active region of the transistor, a first portion of the first region of the semiconductor pattern may be a source or a drain electrode of the transistor, and a second portion of the first region of the semiconductor pattern may be a connection electrode or a connection signal line.

The electronic device 1000 may include the plurality of pixels. Each pixel of the plurality of pixels may include an equivalent circuit that includes seven transistors, one capacitor, and an emission device, but the equivalent circuit of the pixel may be variously changed. The plurality of pixels will be described in more detail below. Referring to FIG. 3, a pixel of the plurality of pixels includes a transistor 100PC and an emission device 100PE.

The transistor 100PC may include a source SC1, an active region A1, a drain D1, and a gate G1. The source SC1, the active region A1, and the drain D1 may be portions of the semiconductor pattern. The source SC1 and the drain D1 may extend from the active region A1 in opposite directions. FIG. 3 illustrates a portion of a connection signal line SCL formed from the semiconductor pattern. The connection signal line SCL may be electrically connected to the drain D1 of the transistor 100PC.

A first insulating layer 10 may be disposed on the buffer layer BFL. The first insulating layer 10 may cover the semiconductor pattern. The first insulating layer 10 may be an inorganic layer and/or an organic layer and may have a single-layered or a multi-layered structure. The first insulating layer 10 may be formed of or include at least one of aluminum oxide, titanium oxide, silicon oxide, silicon nitride, silicon oxynitride, zirconium oxide, or hafnium oxide. In an embodiment, the first insulating layer 10 may be a single layer formed of silicon oxide. Similar to the first insulating layer 10, an insulating layer of the circuit layer 120 that will be described below may be an inorganic layer and/or an organic layer and may be arranged in a single-layered or a multi-layered structure. The inorganic layer may be formed of or include at least one of aluminum oxide, titanium oxide, silicon oxide, silicon nitride, silicon oxynitride, zirconium oxide, or hafnium oxide, but embodiments of the inventive concept are not necessarily limited thereto.

The gate G1 may be disposed on the first insulating layer 10. The gate G1 may be a portion of a metal pattern. The gate G1 may overlap the active region A1. The gate G1 may be a mask in a process of doping the semiconductor pattern.

A second insulating layer 20 may be disposed on the first insulating layer 10 and may cover the gate G1. The second insulating layer 20 may be an inorganic layer and/or an organic layer and may have a single-layered or a multi-layered structure. The second insulating layer 20 may be formed of or include at least one of silicon oxide, silicon nitride, or silicon oxynitride. In an embodiment, the second insulating layer 20 may be arranged in a multi-layered structure that includes a silicon oxide layer and a silicon nitride layer.

A third insulating layer 30 may be disposed on the second insulating layer 20. The third insulating layer 30 may be arranged in a single-layered or a multi-layered structure. For example, the third insulating layer 30 may be arranged in a multi-layered structure that includes a silicon oxide layer and a silicon nitride layer.

A first connection electrode CNE1 may be disposed on the third insulating layer 30. The first connection electrode CNE1 may be coupled to the connection signal line SCL by a contact hole CNT-1 that penetrates the first, second, and third insulating layer 10, 20, and 30.

A fourth insulating layer 40 may be disposed on the third insulating layer 30. The fourth insulating layer 40 may be a single layer formed of silicon oxide. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be coupled to the first connection electrode CNE1 by a contact hole CNT-2 that penetrates the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The emission device layer 130 may be disposed on the circuit layer 120. The emission device layer 130 may include the emission device 100PE. For example, the emission device layer 130 may be formed of or include an organic light emitting material, quantum dots, quantum rods, micro-LEDs, or nano-LEDs. In an embodiment, the emission device 100PE is an organic light emitting device, but embodiments of the inventive concept are not necessarily limited thereto.

The emission device 100PE may include a first electrode AE, an emission layer EL, and a second electrode CE. The first electrode AE may be disposed on the sixth insulating layer 60. The first electrode AE may be coupled to the second connection electrode CNE2 by a contact hole CNT-3 that penetrates the sixth insulating layer 60.

A pixel definition layer 70 may be disposed on the sixth insulating layer 60 and may cover a portion of the first electrode AE. The pixel definition layer 70 may include an opening 70-OP. The opening 70-OP of the pixel definition layer 70 may expose at least a portion of the first electrode AE.

The active region 1000A (e.g., see FIG. 1) may include a light-emitting region PXA and a non-light-emitting region NPXA adjacent to the light-emitting region PXA. The non-light-emitting region NPXA may enclose the light-emitting region PXA. In an embodiment, the light-emitting region PXA may correspond to a region of the first electrode AE exposed through the opening 70-OP.

The emission layer EL may be disposed on the first electrode AE. The emission layer EL may be disposed in a region corresponding to the opening 70-OP. In other words, in an embodiment, the emission layer EL may include a plurality of portions, and a portion of the plurality of portions of the emission layer EL may respectively be disposed in a pixel of the plurality of pixels and may be spaced apart from each other. Each portion of the plurality of portions of the emission layer EL may emit one of blue light, red light, or green light. However, the emission layer EL may alternatively or additionally be provided in two or more pixels in common, and the emission layer EL may emit a blue light or a white light.

The second electrode CE may be disposed on the emission layer EL. The second electrode CE may be a single pattern that is disposed in common throughout the plurality of pixels. The second electrode CE may be referred to as a common electrode CE.

A hole control layer may be disposed between the first electrode AE and the emission layer EL. The hole control layer may be disposed in common in the light-emitting region PXA and the non-light-emitting region NPXA. The hole control layer may include a hole transport layer. In an embodiment, the hole control layer may include a hole injection layer. An electron control layer may be disposed between the emission layer EL and the second electrode CE. The electron control layer may include an electron transport layer. In an embodiment, the electron control layer may include an electron injection layer. The hole control layer and the electron control layer may be formed in common on the plurality of pixels with an open mask.

The encapsulation layer 140 may be disposed on the emission device layer 130. The encapsulation layer 140 may include a first inorganic layer, an organic layer, and a second inorganic layer that are sequentially stacked, but embodiments of the inventive concept are not necessarily limited thereto.

The first and second inorganic layers of the encapsulation layer 140 may protect the emission device layer 130 from moisture or oxygen, and the organic layer of the encapsulation layer 140 may protect the emission device layer 130 from foreign substances (e.g., dust particles). The first and second inorganic layers of the encapsulation layer 140 may include a silicon nitride layer, a silicon oxynitride layer, a silicon oxide layer, a titanium oxide layer, an aluminum oxide layer, or the like. The organic layer of the encapsulation layer 140 may include an acrylic organic layer, but embodiments of the inventive concept are not necessarily limited thereto.

The sensor layer 200 may be formed on the display layer 100 in a successive manner. In an embodiment, the sensor layer 200 is directly disposed on the display layer 100 such that another element or layer is not disposed between the sensor layer 200 and the display layer 100. In other words, an additional adhesive layer may be omitted between the sensor layer 200 and the display layer 100. In an embodiment, the sensor layer 200 may be coupled to the display layer 100 by an adhesive material. The adhesive material may be a typical adhesive material or a typical glue.

The sensor layer 200 may include a base insulating layer 201, a first conductive layer 202, a sensing insulating layer 203, a second conductive layer 204, and a cover insulating layer 205.

The base insulating layer 201 may be an inorganic layer that is formed of or includes at least one of silicon nitride, silicon oxynitride, or silicon oxide. Alternatively, the base insulating layer 201 may be an organic layer that includes at least one of epoxy-based resins, acrylic-based resins, or imide-based resins. The base insulating layer 201 may be arranged in a single-layered structure or may be arranged in a multi-layered structure that includes layers stacked in the third direction DR3.

Each of the first and second conductive layers 202 and 204 may be arranged in a single-layered structure or a multi-layered structure that includes layers stacked in the third direction DR3.

Each of the first and second conductive layers 202 and 204 that are arranged in a single-layered structure may be formed of or include a metal layer or a transparent conductive layer. The metal layer may be formed of or include at least one of molybdenum, silver, titanium, copper, aluminum, or alloys thereof. The transparent conductive layer may include transparent conductive oxide, such as indium tin oxide (ITO), indium zinc oxide (IZO), zinc oxide (ZnO), or indium tin zinc oxide (ITZO). In some embodiments, the transparent conductive layer may include a conductive polymer (e.g., PEDOT), metal nanowires, or graphene.

Each of the first and second conductive layers 202 and 204 that are arranged in a multi-layered structure may include a plurality of metal layers. For example, the plurality of metal layers may be arranged in a triple-layered structure that includes, for example, titanium/aluminum/titanium layers. Each of the first and second conductive layers 202 and 204 that are arranged in a multi-layered structure may include at least one metal layer and at least one transparent conductive layer.

A parasitic capacitor Cb may be formed between the second conductive layer 204 and the second electrode CE. A distance HT in the third direction DR3 between the second conductive layer 204 and the second electrode CE may range from about 8 μm to about 12 μm.

At least one of the sensing insulating layer 203 and the cover insulating layer 205 may include an inorganic layer that may be formed of or include at least one of aluminum oxide, titanium oxide, silicon oxide, silicon nitride, silicon oxynitride, zirconium oxide, or hafnium oxide.

At least one of the sensing insulating layer 203 and the cover insulating layer 205 may include an organic layer that may be formed of or include at least one of acrylate-based resins, methacrylate-based resins, polyisoprene-based resins, vinyl-based resins, epoxy-based resins, urethane-based resins, cellulose-based resins, siloxane-based resins, polyimide-based resins, polyamide-based resins, or perylene-based resins.

Figure 4:
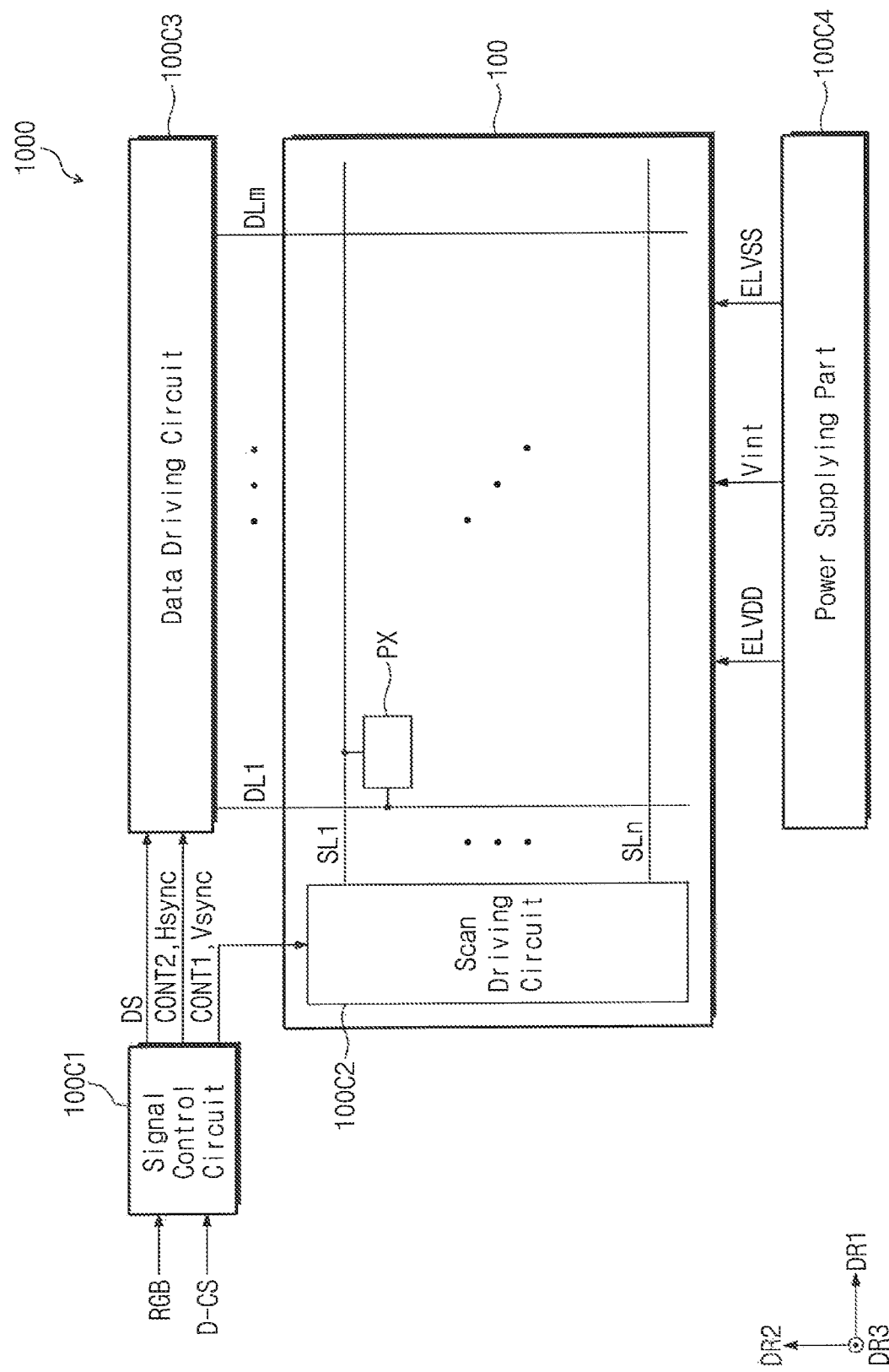
FIG. 4 is a block diagram of the electronic device of FIG. 1 according to an embodiment of the inventive concept.

FIG. 4 is a block diagram of the electronic device 1000 according to an embodiment of the inventive concept.

Referring to FIG. 4, the display layer 100 may include a plurality of scan lines SL1 to SLn, a plurality of data lines DL1 to DLm, and a plurality of pixels PX. Each pixel of the plurality of pixels PX may be connected to a corresponding data line of the plurality of data lines DL1 to DLm and may be connected to a corresponding scan line of the plurality of scan lines SL1 to SLn. In an embodiment, the display layer 100 may include emission control lines, and the electronic device 1000 may include an emission driving circuit that provides control signals to the emission control lines. However, embodiments of the inventive concept are not necessarily limited thereto.

The electronic device 1000 may include a main control unit, a signal control circuit 100C, a scan driving circuit 100C2, a data driving circuit 100C3, and a power supply 100C4.

The signal control circuit 100C1 may receive an image data RGB and a control signal D-CS from the main control unit. The control signal D-CS may include various signals. For example, the control signal D-CS may include an input vertical synchronization signal, an input horizontal synchronization signal, a main clock, a data enable signal, and so forth.

The signal control circuit 100C1 may receive the image data RGB and the control signal D-CS. The control signal D-CS may include various signals. For example, the control signal D-CS may include an input vertical synchronization signal, an input horizontal synchronization signal, a main clock, a data enable signal, and so forth.

In response to the control signal D-CS, the signal control circuit 100C1 may generate a first control signal CONT1 and a vertical synchronization signal Vsync and may output the first control signal CONT1 and the vertical synchronization signal Vsync to the scan driving circuit 100C2. The vertical synchronization signal Vsync may be included in the first control signal CONT1.

In response to the control signal D-CS, the signal control circuit 100C1 may generate a second control signal CONT2 and a horizontal synchronization signal Hsync and may output the second control signal CONT2 and the horizontal synchronization signal Hsync to the data driving circuit 100C3. The horizontal synchronization signal Hsync may be included in the second control signal CONT2.

The signal control circuit 100C1 may realize desired operations of the display layer 100 by obtaining a data signal DS by processing the image data RGB, and may output a data signal DS to the data driving circuit 100C3. The first and second control signals CONT1 and CONT2 may be signals for operations of the scan and data driving circuits 100C2 and 100C3, but embodiments of the inventive concept are not necessarily limited thereto.

The scan driving circuit 100C2 may operate the plurality of scan lines SL1 to SLn in response to the first control signal CONT1 and the vertical synchronization signal Vsync. In an embodiment, the scan driving circuit 100C2 may be formed by the same process as the circuit layer 120 (e.g., see FIG. 2) in the display layer 100, but the scan driving circuit 100C2 may be alternatively or additionally be prepared in the form of a first integrated circuit (IC) and then may be electrically connected to the display layer 100 by directly mounting the first IC on a specific region of the display layer 100 or by mounting the first IC on a first printed circuit board in a chip-on-film (COF) manner.

The data driving circuit 100C3 may output gradation voltages that drive the plurality of data lines DL1 to DLm in response to the second control signal CONT2, the horizontal synchronization signal Hsync, and the data signal DS that may be provided from the signal control circuit 100C1. The data driving circuit 100C3 may be prepared in the form of a second integrated circuit (IC) and then may be electrically connected to the display layer 100 by directly mounting the second IC on a specific region of the display layer 100 or by mounting the second IC on a second printed circuit board in a COF manner, but the data driving circuit 100C3 may alternatively or additionally be formed by the same process as the circuit layer 120 (e.g., see FIG. 2) in the display layer 100.

The power supply 100C4 may supply external voltages to the display layer 100. For example, the power supply 100C4 may supply external voltages that include a first power ELVDD, a second power ELVSS, and a third power Vint to the pixels PX. The first power ELVDD may have a voltage level that is more positive than a voltage level of the second power ELVSS. The third power Vint may be an initialization voltage that initializes a voltage of a gate electrode of a first transistor. The voltage level of the first power ELVDD may be within a range of about 3V to about 6V, and the voltage level of the second power ELVSS may be within a range of about −7V to about 0V. However, embodiments of the inventive concept are not necessarily limited thereto. For example, the voltages of the first and second powers ELVDD and ELVSS may be variously changed within a range that is suitable for operations of the display layer 100.

Figure 5:
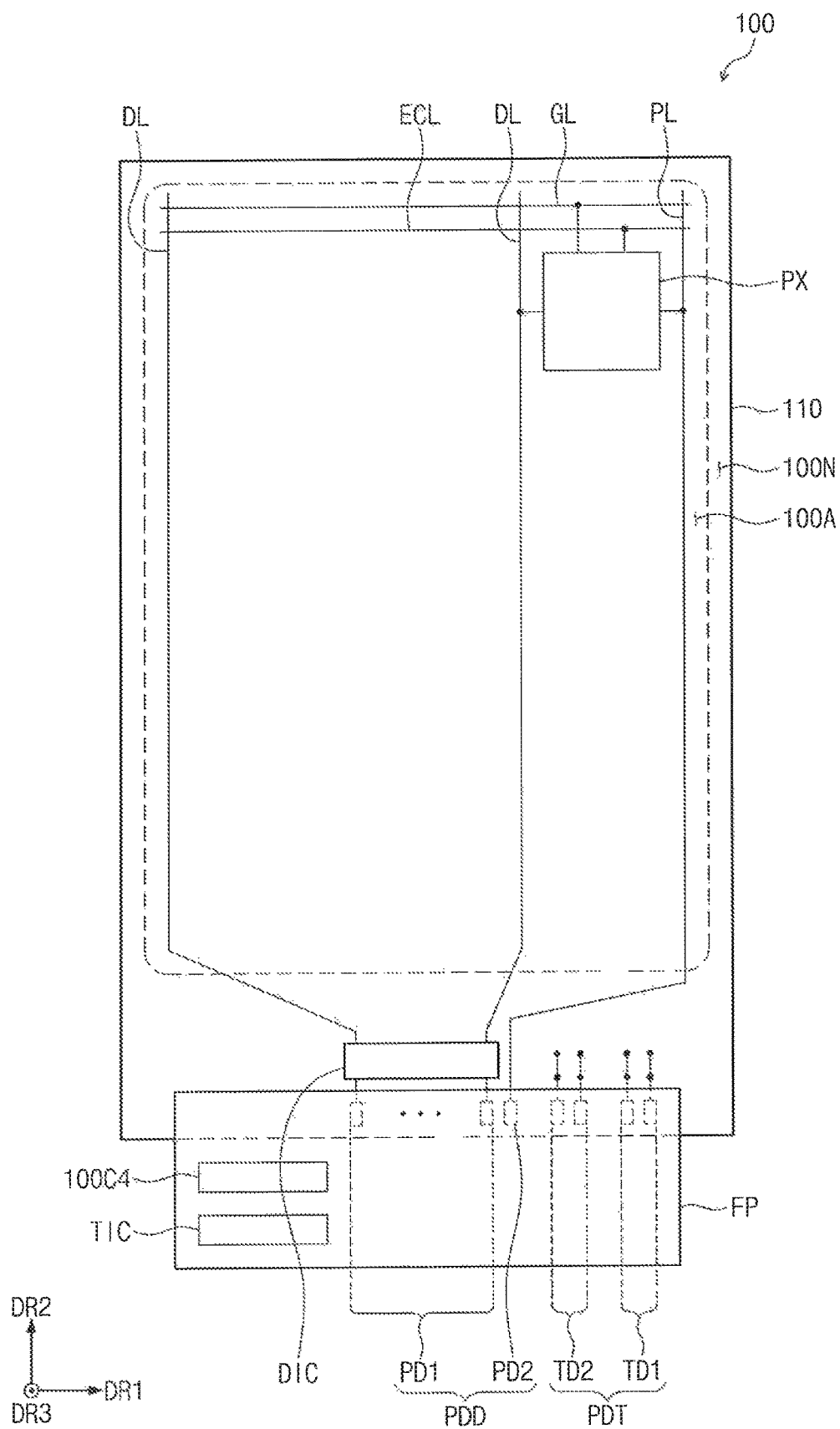
FIG. 5 is a plan view of a display layer of FIG. 2 and a circuit substrate according to an embodiment of the inventive concept.

FIG. 5 is a plan view of the display layer 100 and a circuit substrate according to an embodiment of the inventive concept.

Referring to FIG. 5, the display layer 100 may include an active region 100A and a peripheral region 100N adjacent to the active region 100A. The active region 100A may display an image. The plurality of pixels PX may be disposed in the active region 100A. The peripheral region 100N may be a region on which a driving circuit, a driving line, and so forth are disposed. The active region 100A may be overlapped by the active region 1000A of the electronic device 1000 (e.g., see FIG. 1).

The display layer 100 may include a plurality of signal lines GL, DL, PL, and ECL, a plurality of display pads PDD, and a plurality of sensing pads PDT in addition to the base layer 110 and the plurality of pixels PX.

Each pixel of the plurality of pixels PX may display one of primary colors or one of mixed colors. The primary colors may include red, green, or blue. The mixed colors may include various colors such as white, yellow, cyan, magenta, or other mixed colors.

The plurality of signal lines GL, DL, PL, and ECL may be disposed on the base layer 110. The plurality of signal lines GL, DL, PL, and ECL may be connected to the plurality of pixels PX and may provide electrical signals to the plurality of pixels PX. The plurality of signal lines GL, DL, PL, and ECL may include a plurality of scan lines GL, a plurality of data lines DL, a plurality of power lines PL, and a plurality of emission control lines ECL. In an embodiment, the plurality of signal lines GL, DL, PL, and ECL may further include an initialization voltage line.

The plurality of display pads PDD may be disposed in the peripheral region 100N. The plurality of display pads PDD may include a first pad PD1 and a second pad PD2. In an embodiment, the plurality of display pads PDD may include a plurality of first pads PD1. A first pad of the plurality of first pads PD1 may be connected to a data line of the plurality of data lines DL, respectively. The second pad PD2 may be electrically connected to the power supply 100C4 (e.g., see FIG. 5) and may be electrically connected to the plurality of power lines PL. The display layer 100 may provide external electrical signals through the plurality of display pads PDD to the plurality of pixels PX. In an embodiment, the plurality of display pads PDD may further include additional pads to which other electrical signals are applied in addition to the first pad PD1 and the second pad PD2, but embodiments of the inventive concept are not necessarily limited thereto.

A driving circuit DIC may be mounted on the peripheral region 100N. The driving circuit DIC may be a timing control circuit that is implemented as a chip. The plurality of data lines DL may be electrically connected to the plurality of first pads PD1 through the driving circuit DIC. However, embodiments of the inventive concept are not necessarily limited thereto, and in an embodiment, the driving circuit DIC may be mounted on a circuit substrate FP that is distinct from the display layer 100, and the driving circuit DIC may be electrically connected to the plurality of display pads PDD through the circuit substrate FP.

The plurality of sensing pads PDT may be disposed in the peripheral region 100N. A sensing pad of the plurality of sensing pads PDT may be electrically and respectively connected to a sensing electrode of the plurality of sensing electrodes in the sensor layer 200, which will be described in more detail with reference to FIG. 8. The plurality of sensing pads PDT may include a plurality of first sensing pads TD1 and a plurality of second sensing pads TD2.

The driving circuit DIC may be mounted on the peripheral region 100N, or the driving circuit DIC may alternatively be mounted on the circuit substrate FP that is distinct from the display layer 100, and the driving circuit DIC may be electrically connected to the plurality of display pads PDD through the circuit substrate FP. The driving circuit DIC may output image signals and driving signals that correspond to displaying an image on the display layer 100.

The circuit substrate FP may be disposed on the base layer 110. The circuit substrate FP may include a printed circuit board (PCB) or a flexible printed circuit board (FPCB).

The power supply 100C4 may be disposed on the circuit substrate FP. The power supply 100C4 may be coupled to the plurality of power lines PL. The power supply 100C4 may provide a power signal in common to the plurality of pixels PX. The second pad PD2 may be electrically connected to the power supply 100C4 and may be electrically connected to the plurality of power lines PL.

A sensing driving circuit TIC may be disposed on the circuit substrate FP. The sensing driving circuit TIC may be electrically connected to the plurality of sensing pads PDT. The sensing driving circuit TIC may provide detection signals that control operations of the sensor layer 200 (e.g., see FIG. 2) to the sensor layer 200 (e.g., see FIG. 2) and/or may receive sensing signals that are obtained by sensing an external input that is applied to the sensor layer 200 (e.g., see FIG. 2).

A portion of the circuit substrate FP may be disposed on the peripheral region 100N of the display layer 100. The circuit substrate FP may be electrically connected to the display layer 100 through the plurality of display pads PDD and the plurality of sensing pads PDT. For example, the circuit substrate FP may be electrically connected to the circuit layer 120 (e.g., see FIG. 2) through the plurality of display pads PDD.

Figure 6:
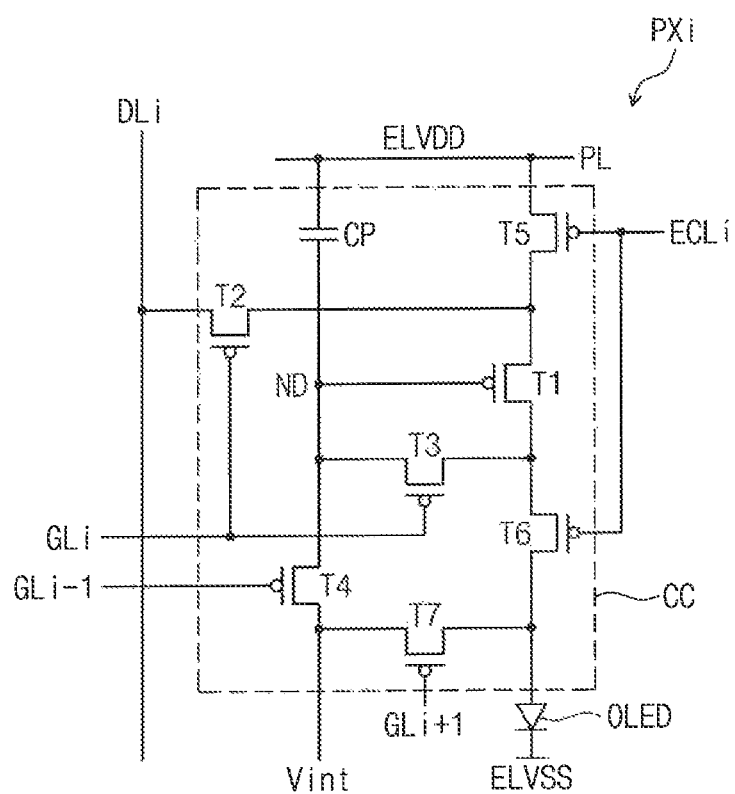
FIG. 6 is an equivalent circuit diagram of a pixel of a plurality of pixels of the electronic device of FIG. 1 according to an embodiment of the inventive concept.

FIG. 6 is an equivalent circuit diagram of a pixel of the plurality of pixels according to an embodiment of the inventive concept.

Referring to FIG. 6, an i-th pixel PXi of the plurality of pixels PX may be connected to an i-th data line DLi of the plurality of data lines DLi, an i-th gate line GLi of the plurality of gate lines GL and to an i-th emission control line ECLi of the plurality of emission control lines ECL. The i-th pixel PXi may be implemented as a circuit having various arrangements as understood by those of ordinary skill in the art.

Referring to FIG. 6, the i-th pixel PXi may include an emission device OLED and a pixel circuit CC. The pixel circuit CC may include a plurality of transistors T1 to T7 and a capacitor CP. The pixel circuit CC may supply a current to the emission device OLED and may control an amount of the current in response to a data signal.

The emission device OLED may emit light and a brightness of the light may be determined based on the amount of the current supplied from the pixel circuit CC. The first power ELVDD may have a voltage level that is more positive than a voltage level of the second power ELVSS.

Each transistor of the plurality of transistors T1 to T7 may include an input or source electrode, an output or drain electrode, and a control or gate electrode. For the sake of convenience, hereinafter, one of the input and output electrodes will be referred to as the first electrode AE (e.g., see FIG. 3) and the other will be referred to as the second electrode CE (e.g., see FIG. 3).

A first electrode AE of a first transistor T1 of the plurality of transistors T1 to T7 may be coupled to the power supply 100C4 (e.g., see FIG. 4) via a fifth transistor T5 of the plurality of transistors T1 to T7. A second electrode CE of the first transistor T1 may be coupled to an anode electrode of the emission device OLED via a sixth transistor T6 of the plurality of transistors T1 to T7. Hereinafter, the first transistor T1 may be referred to as a driving transistor.

The first transistor T1 may control an amount of a current supplied to the emission device OLED in response to a voltage applied to a control electrode of the first transistor T1.

A second transistor T2 of the plurality of transistors T1 to T7 may be disposed between and coupled to the i-th data line DLi and the first electrode AE of the first transistor T1. A control electrode of the second transistor T2 may be coupled to the i-th gate line GLi. When an i-th gate signal is provided to the i-th gate line GLi, the second transistor T2 may be turned on and may therefore electrically connect the i-th data line DLi to the first electrode AE of the first transistor T1.

A third transistor T3 of the plurality of transistors T1 to T7 may be disposed between and coupled to the second electrode CE of the first transistor T1 and the control electrode of the first transistor T1. A control electrode of the third transistor T3 may be coupled to the i-th gate line GLi. When the i-th gate signal is provided to the i-th gate line GLi, the third transistor T3 may be turned on and may therefore electrically connect the second electrode CE of the first transistor T1 to the control electrode of the first transistor T1. Accordingly, when the third transistor T3 is turned on, the first transistor T1 may behave like a diode.

A fourth transistor T4 of the plurality of transistors T1 to T7 may be disposed between and coupled to a node ND and an initialization power generating portion of the power supply 100C4. A control electrode of the fourth transistor T4 may be coupled to an (i−1)-th gate line GLi-1. When an (i−1)-th gate signal is provided to the (i−1)-th gate line GLi-1, the fourth transistor T4 may be turned on and may therefore provide the third power Vint to the node ND.

The fifth transistor T5 may be disposed between and coupled to a power line PL and the first electrode AE of the first transistor T1. The first power ELVDD may be provided on the fifth transistor T5. A control electrode of the fifth transistor T5 may be coupled to the i-th emission control line ECLi.

The sixth transistor T6 may be disposed between and coupled to the second electrode CE of the first transistor T1 and the anode electrode of the emission device OLED. A control electrode of the sixth transistor T6 may be coupled to the i-th emission control line ECLi.

A seventh transistor T7 of the plurality of transistors T1 to T7 may be disposed between and coupled to the initialization power generating portion of the power supply 100C4 (e.g., see FIG. 4) and the anode electrode of the emission device OLED. A control electrode of the seventh transistor 17 may be coupled to an (i+1)-th gate line GLi+1. When an (i+1)-th gate signal is provided to the (i+1)-th gate line GLi+1, the seventh transistor T7 may be turned on and may therefore provide an initialization voltage Vint to the anode electrode of the emission device OLED.

The seventh transistor T7 may increase a black representation ability of the i-th pixel PXi. When the seventh transistor T7 is turned on, a parasitic capacitor of the emission device OLED may be discharged. It may therefore be possible to prevent an unintended light emission of the emission device OLED that may be caused by a leakage current from the first transistor T1, and the black representation ability of the emission device OLED (and therefore the i-th pixel PXi) may thereby be increased.

In FIG. 6, a control electrode of the seventh transistor T7 is coupled to the (i+1)-th gate line GLi+1, but the control electrode of the seventh transistor T7 may alternatively or additionally be coupled to the i-th gate line GLi or to the (i−1)-th gate line GLi-1.

In FIG. 6, the plurality of transistors T1 to T7 of the pixel circuit CC are PMOS transistors, but the plurality of transistors T1 to T7 may alternatively or additionally be NMOS transistors. In an embodiment, the pixel circuit CC may be composed of NMOS and PMOS transistors.

The capacitor CP may be disposed between the power line PL and the node ND. The capacitor CP may store a voltage corresponding to the data signal. When the fifth and sixth transistors T5 and T6 are turned on, an amount of current flowing through the first transistor T1 may be controlled based on a voltage level of the capacitor CP. i-th pixel PXi may be implemented as a circuit having various arrangements as understood by those of ordinary skill in the art.

A driving current may flow from the first power ELVDD to the second power ELVSS through the fifth transistor T5, the first transistor T1, the sixth transistor T6, and the emission device OLED.

Figure 7:
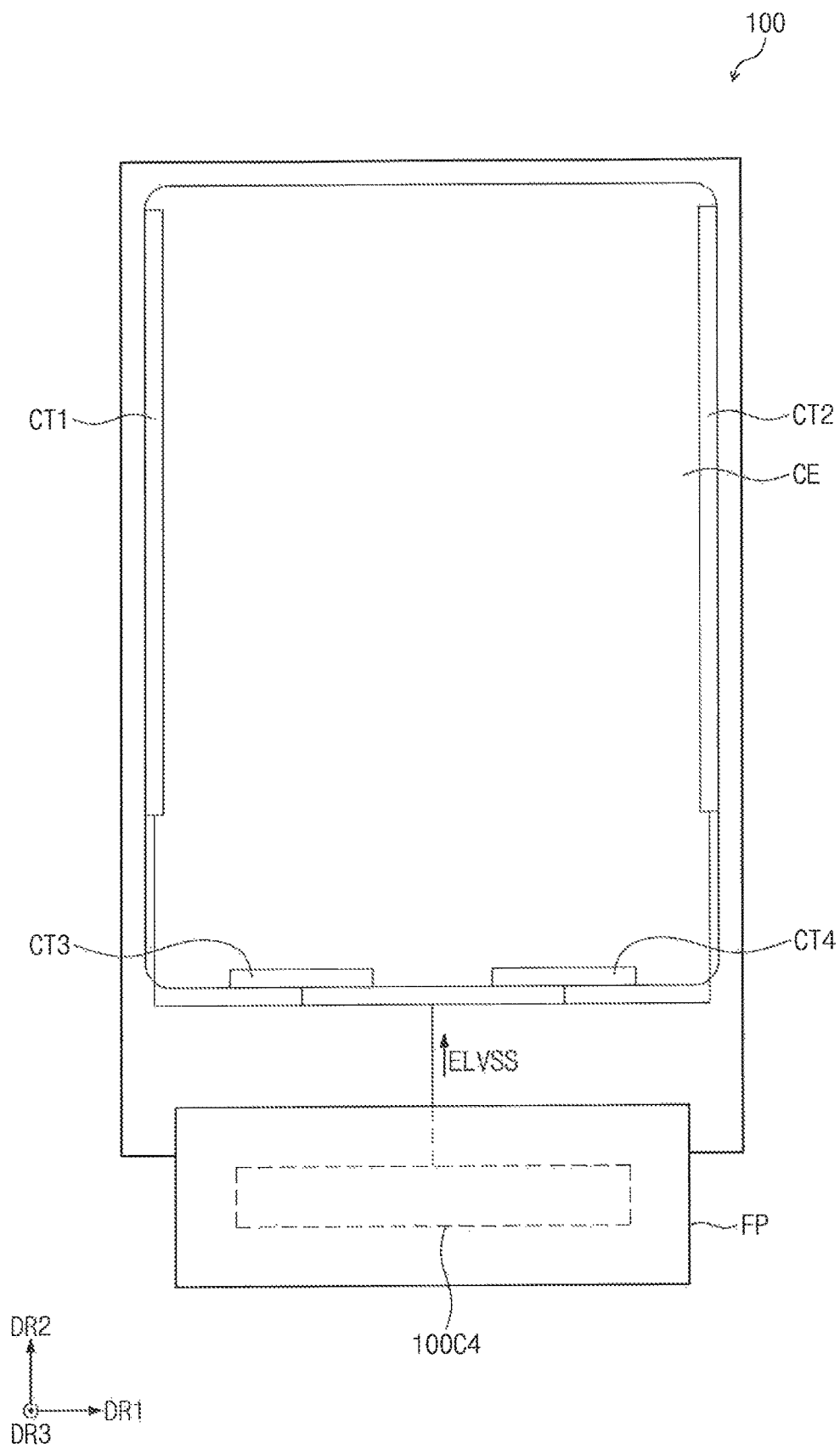
FIG. 7 is a plan view of the display layer of FIG. 2 and a power supply of FIG. 5 according to an embodiment of the inventive concept.

FIG. 7 is a plan view of the display layer 100 and the power supply 100C4 according to an embodiment of the inventive concept.

Referring to FIG. 7, the power supply 100C4 is mounted on the circuit substrate FP, but the power supply 100C4 may alternatively be mounted on the peripheral region 100N of the display layer 100. The power supply 100C4 may provide the second power ELVSS to the common electrode CE.

The display layer 100 may further include a plurality of connection electrodes CT1 to CT4 that are electrically connected to the common electrode CE.

The plurality of connection electrodes CT1 to CT4 may be electrically connected to the power supply 100C4. The plurality of connection electrodes CT1 to CT4 may overlap the common electrode CE. The plurality of connection electrodes CT1 to CT4 may extend in the third direction DR3 and contact the common electrode CE.

The plurality of connection electrodes CT1 to CT4 may include a first connection electrode CT1, a second connection electrode CT2, a third connection electrode CT3, and a fourth connection electrode CT4.

The first connection electrode CT1 may extend in the second direction DR2.

The second connection electrode CT2 may extend in the second direction DR2. The second connection electrode CT2 may be spaced apart from the first connection electrode CT1 in the first direction DR1. The second connection electrode CT2 may face the first connection electrode CT1.

The third connection electrode CT3 may extend in the first direction DR1. The third connection electrode CT3 may be adjacent to the circuit substrate FP.

The fourth connection electrode CT4 may extend in the first direction DR1. The fourth connection electrode CT4 may be adjacent to the circuit substrate FP. The fourth connection electrode CT4 may be spaced apart from the third connection electrode CT3 in the first direction DR1. The fourth connection electrode CT4 may be adjacent to the third connection electrode CT3.

An electrical resistance of the common electrode CE may be reduced by the plurality of connection electrodes CT1 to CT4.

According to an embodiment of the inventive concept, the common electrode CE of the display layer 100 may have a reduced electrical resistance via the plurality of connection electrodes CT1 to CT4. Thus, it may be possible to reduce an amount of heat produced by the common electrode CE. Furthermore, it may be possible to reduce an amount of a current consumed by the common electrode CE. Accordingly, overall operation characteristics of the display layer 100 may be optimized. As a result, it may be possible to increase reliability of the electronic device 1000 (e.g., see FIG. 1).

FIG. 7 shows four connection electrodes in the device layer 100, but in an embodiment, five or more connection electrodes may be electrically connected to the common electrode CE, and the five or more connection electrodes may reduce the electrical resistance of the common electrode CE.

Figure 8:
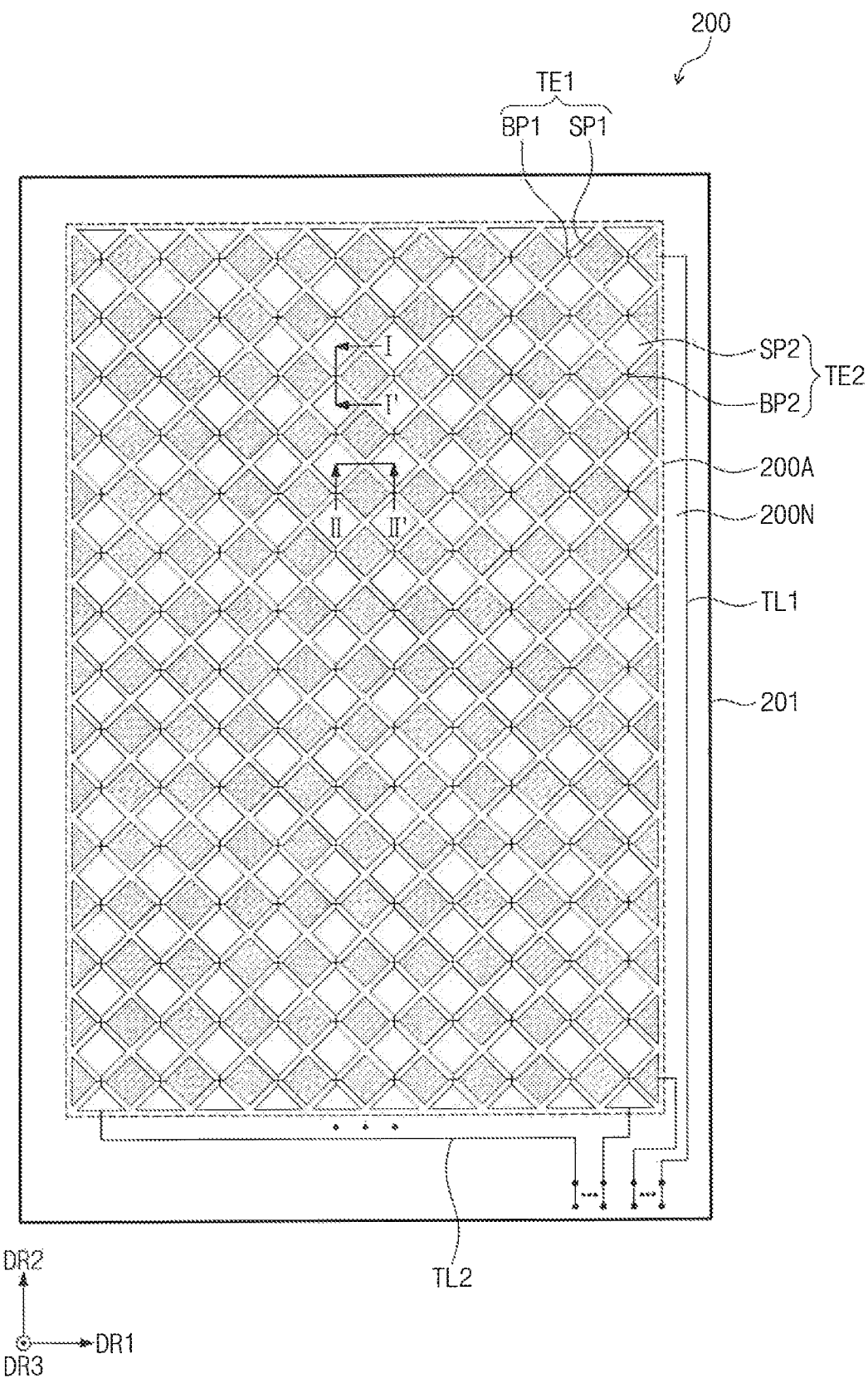
FIG. 8 is a plan view illustrating a sensor layer according to an embodiment of the inventive concept.

FIG. 8 is a plan view of a sensor layer according to an embodiment of the inventive concept.

Referring to FIG. 8, the sensor layer 200 may include an active region 200A and a peripheral region 200N surrounding the active region 200A. The active region 200A may be a region that is activated in response to an electrical signal. For example, the active region 200A may be a region that senses an external input. The active region 200A may overlap the active region 100A of the display layer 100 (e.g., see FIG. 5), and the peripheral region 200N may overlap the peripheral region 100N of the display layer 100 (e.g., see FIG. 5).

The sensor layer 200 may include the base insulating layer 201, first sensing electrodes TE1, second sensing electrodes TE2, and a plurality of sensing lines TL1 and TL2. The first sensing electrodes TE1 and the second sensing electrodes TE2 may be disposed in the active region 200A, and the plurality of sensing lines TL1 and TL2 may be disposed in the peripheral region 200N.

The base insulating layer 201 may be an inorganic layer that is formed of or includes at least one of silicon nitride, silicon oxynitride, or silicon oxide. Alternatively, the base insulating layer 201 may be an organic layer that includes at least one of epoxy-based resins, acrylic-based resins, or imide-based resins. The base insulating layer 201 may be directly formed on the display layer 100 (e.g., see FIG. 2).

The sensor layer 200 may obtain information on an external input based on a capacitance that is measured at a driving frequency of a sensing signal applied between the first and second sensing electrodes TE1 and TE2. In an embodiment, the driving frequency may range from about 250 kHz to about 350 kHz.

Each of the first sensing electrodes TE1 may extend in the first direction DR1. The first sensing electrodes TE1 may be arranged in the second direction DR2. Each of the first sensing electrodes TE1 may include a plurality of first portions SP1 and a plurality of second portions BP1. Each second portion of the plurality of second portions BP1 may electrically connect two adjacent first portions of the plurality of first portions SP1. The plurality of first portions SP1 and the plurality of second portions BP1 may have a mesh structure.

Each of the second sensing electrodes TE2 may extend in the second direction DR2. The second sensing electrodes TE2 may be arranged in the first direction DR1. Each of the second sensing electrodes TE2 may include a plurality of sensing patterns SP2 and a plurality of bridge patterns BP2. Each bridge pattern of the plurality of bridge patterns BP2 may electrically connect two adjacent sensing patterns of the plurality of sensing patterns SP2. The plurality of sensing patterns SP2 may have a mesh structure.

FIG. 8 shows a bridge pattern of the plurality of bridge pattern BP2 connected to two adjacent sensing patterns of the plurality of sensing patterns SP2, but the connection structure between the plurality of bridge patterns BP2 and the plurality of sensing patterns SP2 is not necessarily limited thereto. For example, in an embodiment, a pair of sensing patterns of the plurality of sensing patterns SP2 that are adjacent to each other may be connected to each other by a pair of bridge patterns of the plurality of bridge patterns BP2.

The plurality of second portions BP1 and the plurality of bridge patterns BP2 may be disposed on different layers. The plurality of bridge patterns BP2 may cross the first sensing electrodes TE1 and may be electrically disconnected from the first sensing electrodes TE1. For example, the plurality of the second portions BP1 may cross each bridge pattern of the plurality of bridge patterns BP2 and may be electrically disconnected from the plurality of bridge patterns BP2.

The first conductive layer 202 (e.g., see FIG. 2) may include the plurality of bridge patterns BP2, and the second conductive layer 204 (e.g., see FIG. 2) may include the first sensing electrodes TE1 and the plurality of sensing patterns SP2.

The plurality of sensing lines TL1 and TL2 may include a plurality of first sensing lines TL1 and a plurality of second sensing lines TL2. A first sensing line of the plurality of first sensing lines TL1 may be electrically connected to a first sensing electrodes TE1, respectively. A second sensing line of the plurality of second sensing lines TL2 may be electrically connected to a second sensing electrode TE2, respectively. Each sensing line of the plurality of sensing lines TL1 and TL2 may have a mesh structure.

A first sensing pad of the plurality of first sensing pads TD1 (e.g., see FIG. 5) may be electrically connected to a first sensing line of the plurality of first sensing lines TL1, respectively, by a contact hole. A second sending pad of the plurality of second sensing pads TD2 (e.g., see FIG. 5) may be electrically connected to a second sensing line of the plurality of second sensing lines TL2, respectively, by a contact hole.

Figure 9A:
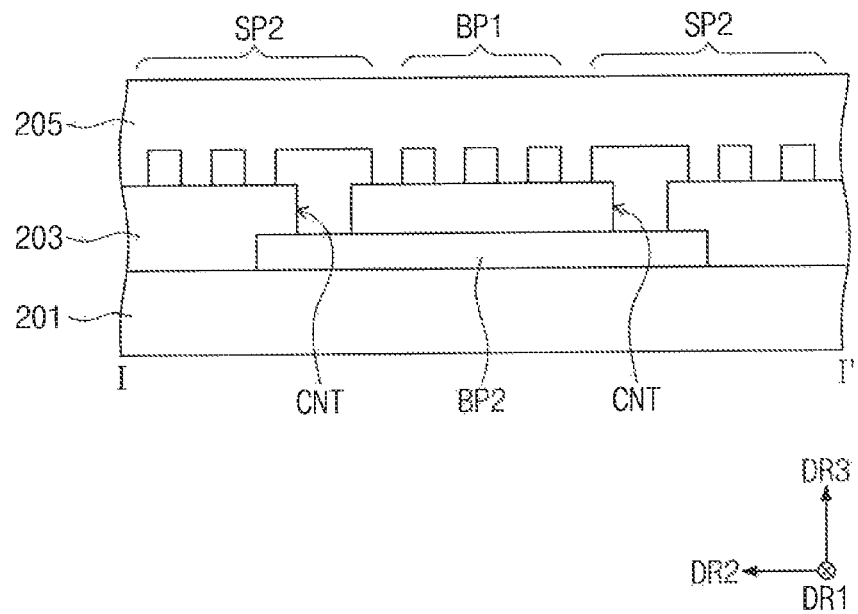
FIG. 9A is a sectional view taken along a line I-I' of FIG. 8.

FIG. 9A is a sectional view taken along a line I-I' of FIG. 8.

Referring to FIGS. 8 and 9A, the plurality of bridge patterns BP2 may be disposed on the base insulating layer 201. The sensing insulating layer 203 may be disposed on the plurality of bridge patterns BP2. The sensing insulating layer 203 may be arranged in a single-layered or a multi-layered structure. The sensing insulating layer 203 may be formed of or include at least one of inorganic, organic, or composite materials.

The plurality of sensing patterns SP2, the plurality of first portions SP1, and the plurality of second portions BP1 may be disposed on the sensing insulating layer 203. The plurality of sensing patterns SP2, the plurality of first portions SP1, and the plurality of second portions BP1 may have a mesh structure.

A plurality of contact holes CNT may penetrate the sensing insulating layer 203 in the third direction DR3. Two adjacent sensing patterns of the plurality of sensing patterns SP2 may be connected to the bridge pattern BP2 by the plurality of contact holes CNT and thus may be electrically connected to each other.

The cover insulating layer 205 may be disposed on the plurality of sensing patterns SP2, the plurality of first portions SP1, and the plurality of second portions BP1. The cover insulating layer 205 may have a single-layered structure or a multi-layered structure. The cover insulating layer 205 may be formed of or include at least one of inorganic, organic, or composite materials.

FIG. 9A illustrates a bottom bridge structure in which the plurality of bridge patterns BP2 are disposed below the plurality of sensing patterns SP2, the plurality of first portions SP1, and the plurality of second portions BP1, but embodiments of the inventive concept are not necessarily limited thereto. For example, the sensor layer 200 may be arranged in a top bridge structure in which the plurality of bridge patterns BP2 are disposed on the plurality of sensing patterns SP2, the plurality of first portions SP1, and the plurality of second portions BP1.

Figure 9B:
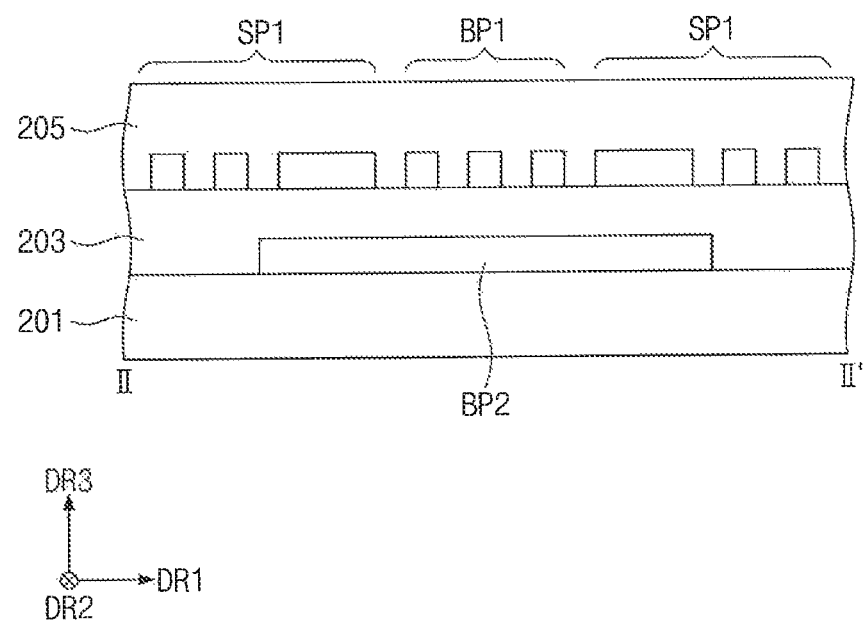
FIG. 9B is a sectional view taken along a line II-II' of FIG. 8.

FIG. 9B is a sectional view taken along a line II-II' of FIG. 8. In the following description of FIG. 9B, repeated description of elements previously described with reference to FIGS. 8 and 9A will be omitted for the sake of brevity.

Referring to FIG. 9B, the plurality of first portions SP1 and the plurality of second portions BP1 may be disposed on the plurality of bridge patterns BP2. Each of the plurality of second portions BP1 may connect two adjacent first portions of the plurality of first portions SP1 to each other. The plurality of first portions SP1 and the plurality of second portions BP1 may have a mesh structure.

Figure 10:
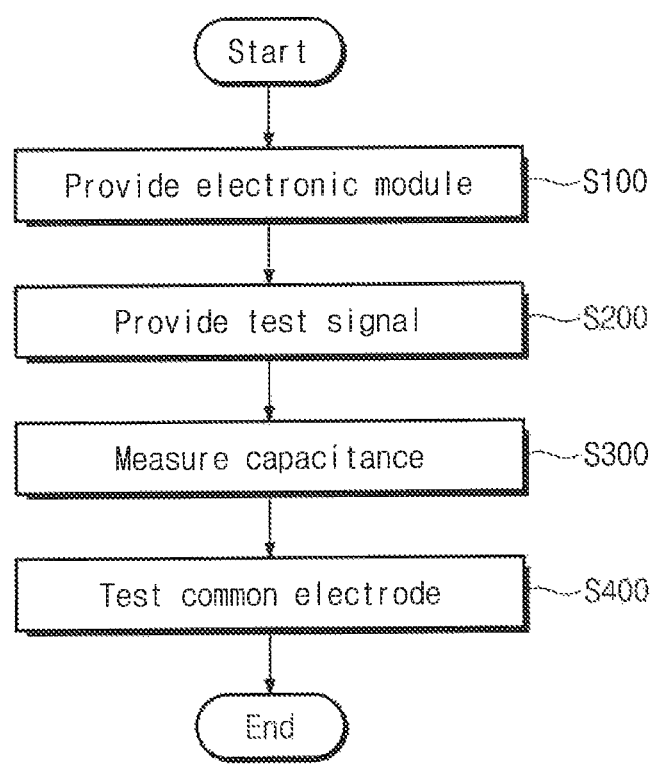
FIG. 10 is a flow chart illustrating a method of testing an electronic device according to an embodiment of the inventive concept.
Figure 11:
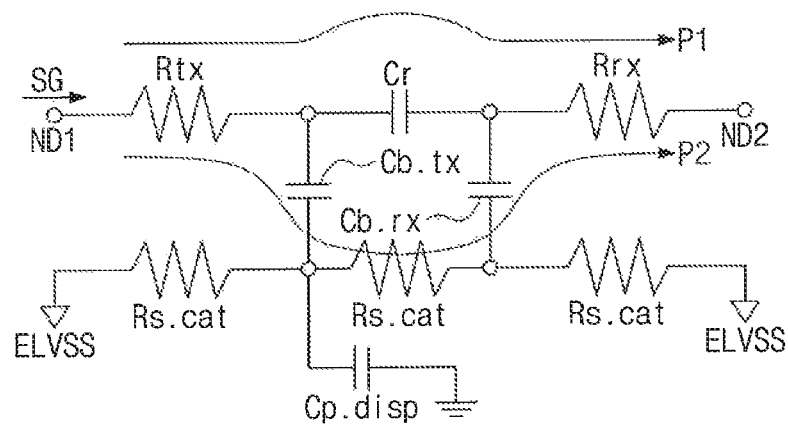
FIG. 11 is a circuit diagram of an electronic device according to an embodiment of the inventive concept.
Figure 12:
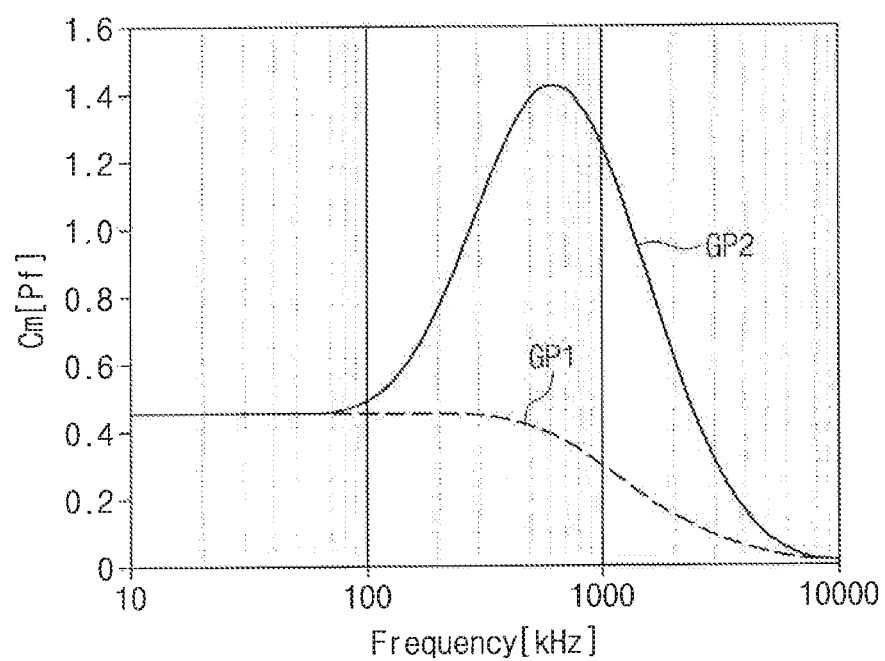
FIG. 12 is a graph showing capacitance-frequency characteristics according to an embodiment of the inventive concept.

FIG. 10 is a flow chart illustrating a method of testing an electronic device according to an embodiment of the inventive concept, FIG. 11 is a circuit diagram of an electronic device according to an embodiment of the inventive concept, and FIG. 12 is a graph showing capacitance-frequency characteristics of the electronic device 1000 according to an embodiment of the inventive concept.

Referring to FIGS. 7 to 12, the electronic device 1000 (e.g., of FIG. 1) may be provided (S100). The electronic device 1000 may include the display layer 100 that includes the common electrode CE, and the sensor layer 200 that includes the first and second sensing electrodes TE1 and TE2.

A test signal SG with a test frequency may be applied to a first sensing electrode of the plurality of sensing electrodes TE1 (S200). For example, the test signal SG may be input to a first node ND1 and may be output to a second node ND2. The test frequency may range from about 500 kHz to about 700 kHz. The test frequency may be higher than the driving frequency for the operations of the sensor layer 200.

The test signal SG may include a first signal P1 and a second signal P2.

The first signal P1 may be a signal passing through a first resistor Rtx of a first sensing electrode TE1, a first capacitor Cr, and a second resistor Rrx of the second sensing electrode of a second sensing electrode TE2. The first signal P1 may contain information corresponding to the first capacitor Cr between the first and second sensing electrodes TE1 and TE2.

The second signal P2 may a signal passing through the first resistor Rtx of the first sensing electrode TE1, a first parasitic capacitor Cb.tx disposed between the first sensing electrode TE1 and the common electrode CE, a resistor Rs.cat of the common electrode CE, a second parasitic capacitor Cb.rx disposed between the second sensing electrode TE2 and the common electrode CE, and the second resistor Rrx of the second sensing electrode TE2. The second signal P2 may contain information corresponding to a second capacitor disposed between the first sensing electrode TE1, the common electrode CE, and the second sensing electrode TE2.

The parasitic capacitor Cb (e.g., see FIG. 3) may include the first parasitic capacitor Cb.tx and the second parasitic capacitor Cb.rx. The distance HT (e.g., see FIG. 3) between each of the first and second sensing electrodes TE1 and TE2 and the second electrode CE (e.g., see FIG. 3) may range from about 8 μm to about 12 μm. In a comparative example, when the distance HT (e.g., see FIG. 3) is smaller than 8 μm, a capacitance of each of the first and second parasitic capacitors Cb.tx and Cb.rx may be increased, and when a signal having a driving frequency between the first and second sensing electrodes TE1 and TE2 is provided, the signal may be easily transmitted to the common electrode CE and may thereby produce noise when an image is displayed on the display layer 100. By contrast, in a comparative example, when the distance HT (e.g., see FIG. 3) is larger than 12 μm, at least one of the display and sensor layers 100 and 200 of the electronic device 1000 (e.g., see FIG. 1) may have an increased thickness, and thus, the capacitance of each of the first and second parasitic capacitors Cb.tx and Cb.rx may be decreased. The test signal SG may accordingly not pass through the first parasitic capacitor Cb.tx, and thus, the second signal P2 may not be formed.

A capacitance between the first and second sensing electrodes TE1 and TE2 may be measured from the test signal SG (in S300). FIG. 12 shows a variation in capacitance Cm between the first and second nodes ND1 and ND2 versus a change in frequency of the test signal SG.

The capacitance Cm may be a sum of capacitances of the first capacitor Cr and the second capacitor.

Referring to FIG. 12, the first curve GP1 is a comparative example that shows an ideal behavior of the capacitance Cm between the first and second nodes ND1 and ND2 versus a change in the frequency of the test signal SG in which the parasitic capacitor Cb (e.g., see FIG. 3) has no effect. In other words, the first curve GP1 may be a capacitance-frequency curve that is obtained when the capacitance Cm is induced by only the first signal P1.

In contrast to the first curve GP1, a second curve GP2 is a capacitance-frequency curve showing a behavior of the capacitance Cm between the first and second nodes ND1 and ND2 according to an embodiment of the inventive concept, i.e., in the electronic device 1000 (e.g., see FIG. 1). In other words, the second curve GP2 may be a capacitance-frequency curve obtained when the capacitance Cm is induced by both of the first and second signals P1 and P2.

If the frequency of the test signal SG is increased, the capacitance Cm may be more strongly influenced by the second signal P2. This means that the capacitance Cm may change depending on a change of the second signal P2.

The common electrode CE may be tested based on the capacitance Cm (in S400). Based on the measurement of the capacitance Cm, it may be determined whether electric connection between the common electrode CE and the first to fourth connection electrodes CT1, CT2, CT3, and CT4 is in a normal state or not. Hereinafter, the capacitance Cm, which is measured from the test signal SG when the first to fourth connection electrodes CT1, CT2, CT3, and CT4 are in a normal connection state, will be referred to as a reference capacitance.

When at least one of the first to fourth connection electrodes CT1, CT2, CT3, and CT4 is not electrically connected to the common electrode CE, the resistor Rs.cat of the common electrode CE may have an increased resistance. Due to the increased resistance of the resistor Rs.cat, the second signal P2 may not be transmitted to the power supply 100C4 that supplies the second power ELVSS, but may be transmitted to the second node ND2. That is, due to the second signal P2, the second capacitor may have an increased capacitance. Accordingly, the capacitance Cm measured with the test signal SG may be increased.

If the capacitance Cm, which is measured by providing the test signal SG to the electronic device 1000 (e.g., see FIG. 1), is higher than the reference capacitance, it may be determined that at least one of the first to fourth connection electrodes CT1, CT2, CT3, and CT4 is electrically disconnected from the common electrode CE. In this case, the common electrode CE may be determined to be in a failed state.

For example, when the third connection electrode CT3 is not connected to the common electrode CE, a first region of the common electrode CE adjacent to the third connection electrode CT3 may have an increased resistance. Thus, the capacitance Cm, which is measured at the first region using the test signal SG, may be higher than the reference capacitance. Accordingly, based on the measured value of the capacitance Cm, it may be determined that the third connection electrode CT3 is electrically disconnected from the common electrode CE. Furthermore, when the fourth connection electrode CT4 is not connected to the common electrode CE, a second region of the common electrode CE adjacent to the fourth connection electrode CT4 and different from the first region may have an increased resistance. Thus, the capacitance Cm, which is measured at the second region using the test signal SG, may be higher than the reference capacitance. Accordingly, based on the measured value of the capacitance Cm, it may be determined that the fourth connection electrode CT4 is electrically disconnected from the common electrode CE.

If the capacitance Cm, which is measured by providing the test signal SG to the electronic device 1000 (e.g., see FIG. 1), is equal to the reference capacitance, it may be determined that each of the first to fourth connection electrodes CT1, CT2, CT3, and CT4 is electrically connected to the common electrode CE. In this case, the common electrode CE may be determined to be in a not-failed state.

According to an embodiment of the inventive concept, when each of the first to fourth connection electrodes CT1, CT2, CT3, and CT4 is electrically connected to the common electrode CE, the common electrode CE may have a low resistance. Thus, it may be possible to reduce an amount of heat produced by the common electrode CE. Furthermore, it may be possible to reduce an amount of a current consumed by the common electrode CE. Accordingly, overall operation characteristics of the display layer 100 may be optimized. As a result, it may be possible to increase reliability of the electronic device 1000 (e.g., see FIG. 1).

Referring to the second curve GP2, a test frequency of the test signal SG may range from about 500 kHz to about 700 kHz. In a comparative example, if the test frequency is lower than 500 kHz, the second signal P2 may have less influence on the capacitance Cm, and thus, it may be difficult to determine whether the common electrode CE is in a failed state. By contrast, in a comparative example, if the test frequency is higher than 700 kHz, it may exceed a range of frequency that can be processed by the sensing driving circuit TIC (e.g., see FIG. 5), and thus the measurement of the capacitance Cm may be impossible. However, the inventive concept is not necessarily limited thereto. For example, the test frequency may increase above 700 kHz according to the signal processing ability of the sensing driving circuit TIC (e.g., see FIG. 5).

According to a comparative example, an image that is displayed on the active region 100A (e.g., see FIG. 5) when the display layer 100 is operated is used to determine whether the common electrode CE is normally connected to the first to fourth connection electrodes CT1, CT2, CT3, and CT4. However, in this comparative example, there may be a difficulty in correctly determining a connection state of each of the first to fourth connection electrodes CT1, CT2, CT3, and CT4, because the image may be normally displayed on the active region 100A (e.g., see FIG. 5) even when one of the first to fourth connection electrodes CT1, CT2, CT3, and CT4 is in an abnormal connection state. By contrast, in a method of testing the electronic device 1000 (e.g., see FIG. 1) according to an embodiment of the inventive concept, the capacitance Cm of each regions on which the first to fourth connection electrodes CT1, CT2, CT3, and CT4 are respectively disposed may be measured using the test signal SG of a sensing frequency provided to the sensor layer 200, and a connection state of each of the first to fourth connection electrodes CT1, CT2, CT3, and CT4 may then be determined based on the measured capacitance Cm, and not the image displayed on the active region 100A (e.g., see FIG. 5) of the display layer 100. Accordingly, it may be possible to increase testing reliability of the electronic device 1000 (e.g., see FIG. 1).

According to an embodiment of the inventive concept, by providing first to fourth connection electrodes, it may be possible to reduce resistance of a common electrode of a display layer, and it may therefore be possible to reduce an amount of heat produced by the common electrode and thereby reduce an amount of a current consumed by the common electrode. Accordingly, overall operation characteristics of the display layer may be optimized and an electronic device with increased reliability may be provided.

Furthermore, in a method of testing an electronic device according to an embodiment of the inventive concept, a test signal that is provided to a sensor layer and has a sensing frequency may be used to measure a capacitance of each region of the electronic device that includes the first to fourth connection electrodes, and accordingly, it may be possible to determine whether each of the first to fourth connection electrodes is in a normal connection state based on the measured capacitance. Accordingly, it may be possible to increase test reliability in a method of testing an electronic device.

While the inventive concept has been particularly shown and described with reference to embodiments thereof, it will be understood by one of ordinary skill in the art that variations in form and detail may be made therein without departing from the spirit and scope of the present disclosure.

What is claimed is:

1. A method of testing an electronic device, the method comprising:
    providing the electronic device, wherein the electronic device comprises:
        a display layer that includes a common electrode; and
        a sensor layer disposed on the display layer and that includes a first sensing electrode and a second sensing electrode, wherein the first sensing electrode and the second sensing electrode cross each other and are electrically disconnected;
    providing a test signal that includes a test frequency to the first sensing electrode;
    measuring a capacitance of a capacitor disposed between the first and second sensing electrodes based on the test signal; and
    testing the common electrode based on the capacitance.

2. The method of claim 1, wherein the test frequency ranges from 500 kHz to 700 kHz.

3. The method of claim 1, wherein the electronic device further comprises a power supply that provides a power to the common electrode, and
    wherein the display layer further comprises a first connection electrode, a second connection electrode, a third connection electrode, and a fourth connection electrode electrically connecting the common electrode to the power supply.

4. The method of claim 3, wherein each of the first and second connection electrodes extend in a first direction facing each other, and
    each of the third and fourth connection electrodes extend in a second direction crossing the first direction and are adjacent to each other.

5. The method of claim 3, wherein the testing of the common electrode comprises determining an electric connection state between the common electrode and the first to fourth connection electrodes.

6. The method of claim 5, wherein the determining of the electric connection state between the common electrode and the first to fourth connection electrodes comprises determining that at least one of the first to the fourth connection electrodes is electrically disconnected from the common electrode when the capacitance is higher than a reference capacitance.

7. The method of claim 5, wherein the determining of the electric connection state between the common electrode and the first to fourth connection electrodes comprises determining that each of the first to the fourth connection electrodes is electrically connected to the common electrode when the capacitance is equal to a reference capacitance.

8. The method of claim 1, wherein the capacitor includes a first capacitor between the first and second sensing electrodes and a second capacitor between the first sensing electrode, the common electrode, and the second sensing electrode.

9. The method of claim 8, wherein the test signal comprises a first signal that includes information corresponding to the first capacitor, and a second signal that includes information corresponding to the second capacitor.

10. The method of claim 9, wherein the providing of the test signal comprises changing the capacitance based on changing the second signal.

11. The method of claim 10, wherein the testing of the common electrode comprises determining that the common electrode is in a failed state when the capacitance is higher than a reference capacitance.

12. The method of claim 10, wherein the testing of the common electrode comprises determining that the common electrode is in a not-failed state when the capacitance is equal to a reference capacitance.

13. The method of claim 1, wherein a distance between the first sensing electrode and the common electrode ranges from 8 μm to 12 μm.

14. A method of testing an electronic device, the method comprising:
- providing the electronic device, wherein the electronic device comprises:
  - a display layer that includes a common electrode; and
  - a sensor layer directly disposed on the display layer and that includes a plurality of sensing electrodes operating at a driving frequency;
- providing a test signal that includes a test frequency higher than the driving frequency to some sensing electrodes of the plurality of sensing electrodes; and
- determining whether the common electrode is in a failed state based on the test signal.

15. The method of claim 14, wherein the test frequency ranges from 500 kHz to 700 kHz.

16. The method of claim 14, wherein:
- the test signal comprises a first signal and a second signal, wherein the first signal is different from the second signal;
- the first signal comprises information corresponding to a first capacitor disposed between a pair of sensing electrodes of the plurality of sensing electrodes; and
- the second signal comprises information corresponding to a second capacitor disposed between a first sensing electrode of the plurality of sensing electrodes, the common electrode, and a second sensing electrode of the plurality of sensing electrodes.

17. The method of claim 16, wherein the determining whether the common electrode is in a failed state comprises determining that the common electrode is in the failed state when a sum of capacitances of the first and second capacitors is higher than a reference capacitance.

18. The method of claim 16, wherein the determining whether the common electrode is in a failed state comprises determining that the common electrode is in a not-failed state when a sum of capacitances of the first and second capacitors is equal to a reference capacitance.

19. An electronic device comprising:
- a display layer that includes a common electrode and a plurality of connection electrodes electrically connected to the common electrode;
- a sensor layer disposed on the display layer, the sensor layer comprising a first sensing electrode and a second sensing electrode crossing each other and electrically disconnected; and
- a power supply that provides a power to the common electrode,
- wherein the plurality of connection electrodes is electrically connected to the power supply and includes a first connection electrode and a second connection electrode extending in a first direction and facing each other, and a third connection electrode and a fourth connection electrode extending in a second direction crossing the first direction and adjacent to each other.

20. The electronic device of claim 19, wherein a distance between the first sensing electrode and the common electrode ranges from 8 μm to 12 μm.

* * * * *